(12) United States Patent
Okada et al.

(10) Patent No.: US 10,319,089 B2
(45) Date of Patent: Jun. 11, 2019

(54) COMPONENT MOUNTER

(71) Applicant: Panasonic Intellectual Property Management Co., Ltd., Osaka (JP)

(72) Inventors: Yasuichi Okada, Yamanashi (JP); Eyri Watari, Yamanashi (JP)

(73) Assignee: PANASONIC INTELLECTUAL PROPERTY MANAGEMENT CO., LTD, Osaka (JP)

( * ) Notice: Subject to any disclaimer, the term of this patent is extended or adjusted under 35 U.S.C. 154(b) by 231 days.

(21) Appl. No.: 15/297,614

(22) Filed: Oct. 19, 2016

(65) Prior Publication Data

US 2017/0252880 A1    Sep. 7, 2017

(30) Foreign Application Priority Data

Mar. 4, 2016   (JP) .................................. 2016-041684

(51) Int. Cl.
*B23P 19/04*   (2006.01)
*G06T 7/00*   (2017.01)
(Continued)

(52) U.S. Cl.
CPC ......... *G06T 7/0008* (2013.01); *H04N 5/2257* (2013.01); *H05K 13/041* (2018.08);
(Continued)

(58) Field of Classification Search
CPC ............... H05K 13/04; H05K 13/0404; H05K 13/0408; H05K 13/0409; H05K 13/041; H05K 13/0411; H05K 13/0413; H05K 13/08; H05K 13/081; H05K 13/0812; H05K 13/0882; Y10T 29/4913; Y10T 29/49131; Y10T 29/49133; Y10T 29/53039;
(Continued)

(56) References Cited

U.S. PATENT DOCUMENTS 5,660,519 A * 8/1997 Ohta ..................... H01L 21/681
29/743
2006/0185162 A1* 8/2006 Aoki .................. H05K 13/0452
29/832
(Continued)

FOREIGN PATENT DOCUMENTS

JP   2008-124293 A   5/2008
JP     4331054 B    9/2009
(Continued)

*Primary Examiner* — Peter Dungba Vo
*Assistant Examiner* — Joshua D Anderson
(74) *Attorney, Agent, or Firm* — Pearne & Gordon LLP

(57) ABSTRACT

A component mounter includes a side imaging camera that is provided to be integral with the placing head having a plurality of suction nozzles, that moves relatively with respect to the plurality of suction nozzles, and thereby that images, from a side, peripheral regions of front ends of the plurality of suction nozzles, respectively, in order. Incidentally, a component presence/absence determiner (determiner) determines the presence or absence of a component sucked on the front end of the suction nozzle, based on primary image data obtained by the side imaging camera and the calculator calculates a thickness of the component sucked on the front end of the suction nozzle, based on secondary image data obtained by the side imaging camera.

14 Claims, 13 Drawing Sheets

(51) Int. Cl.
*G06T 7/60* (2017.01)
*H04N 5/225* (2006.01)
*H05K 13/04* (2006.01)
*H05K 13/08* (2006.01)

(52) U.S. Cl.
CPC ..... *H05K 13/0404* (2013.01); *H05K 13/0812* (2018.08); *H05K 13/0813* (2018.08); *G06T 2207/30148* (2013.01); *Y10T 29/49131* (2015.01); *Y10T 29/53174* (2015.01); *Y10T 29/53191* (2015.01)

(58) Field of Classification Search
CPC ......... Y10T 29/53174; Y10T 29/53178; Y10T 29/53191
See application file for complete search history.

(56) References Cited

U.S. PATENT DOCUMENTS

| | | | |
|---|---|---|---|
| 2009/0225304 A1* | 9/2009 | Hiyoshi | H05K 13/0812 356/72 |
| 2009/0300908 A1* | 12/2009 | Endo | H05K 13/04 29/739 |
| 2012/0162405 A1* | 6/2012 | Inagaki | H05K 13/08 348/87 |
| 2018/0192558 A1* | 7/2018 | Yamakage | H05K 13/04 |

FOREIGN PATENT DOCUMENTS

| | | |
|---|---|---|
| JP | 2010-199446 A | 9/2010 |
| JP | 2013-191771 A | 9/2013 |
| WO | 2009-094375 A | 4/2009 |
| WO | 2014/147806 | 9/2014 |

\* cited by examiner

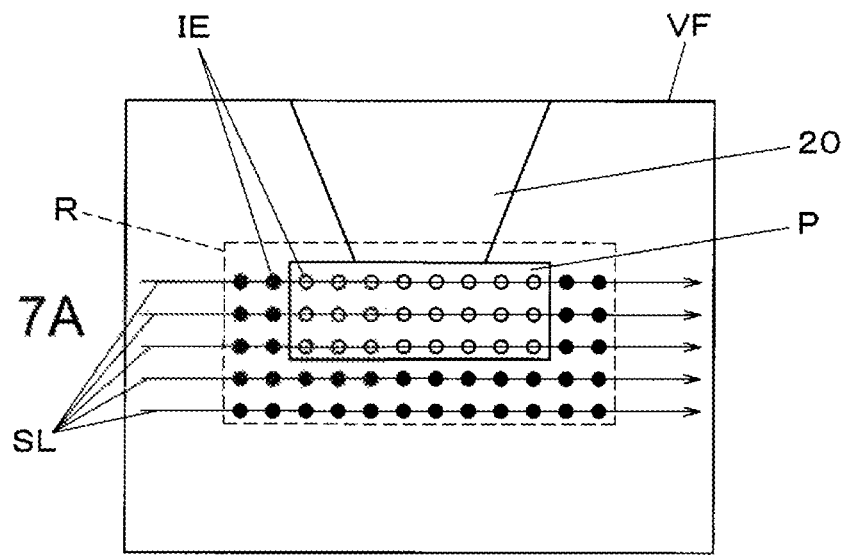
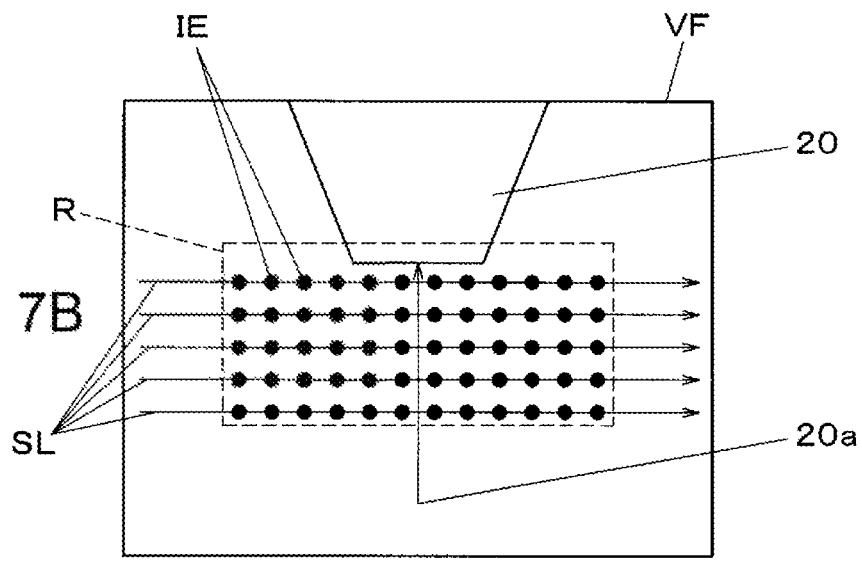

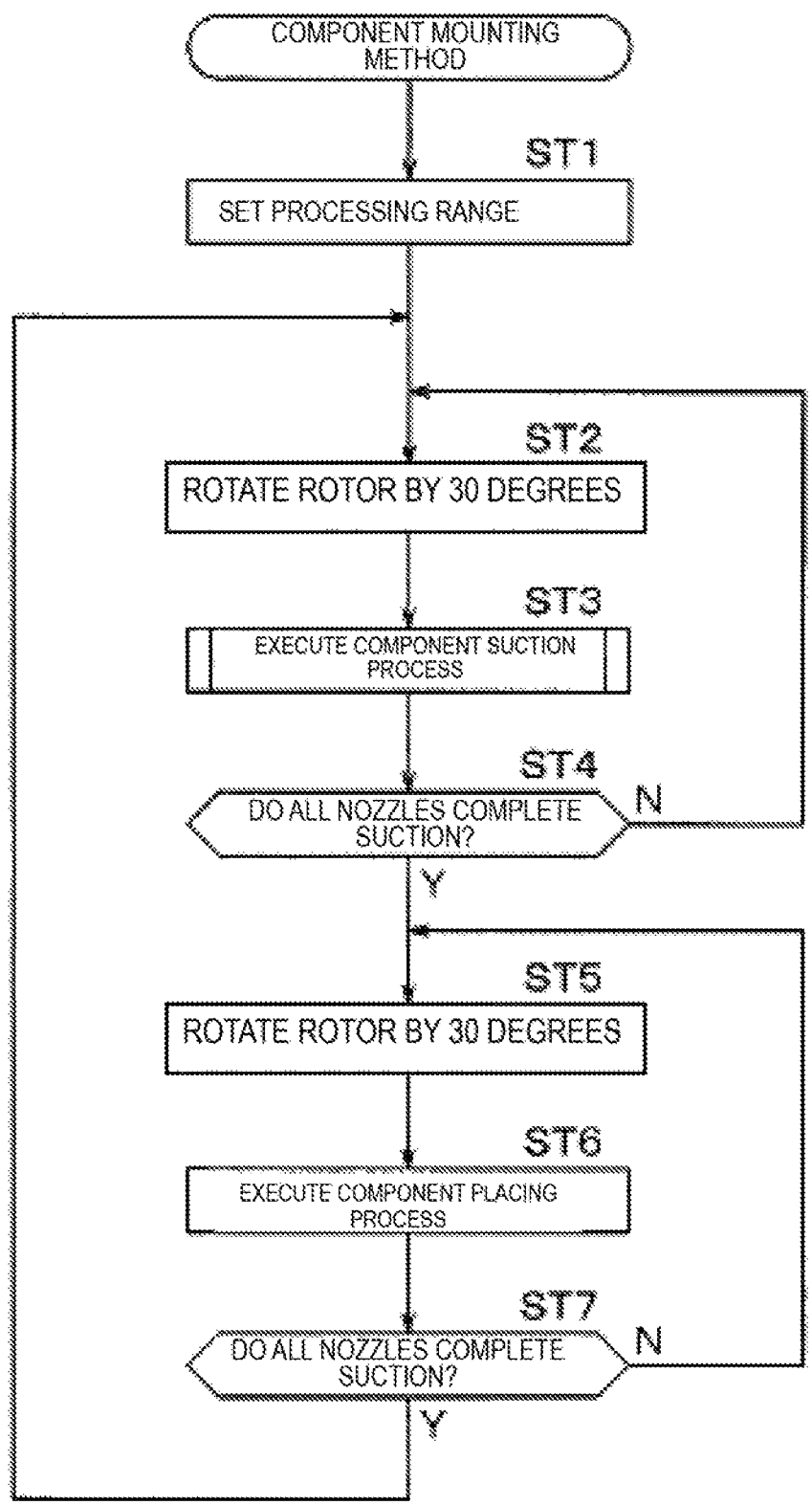

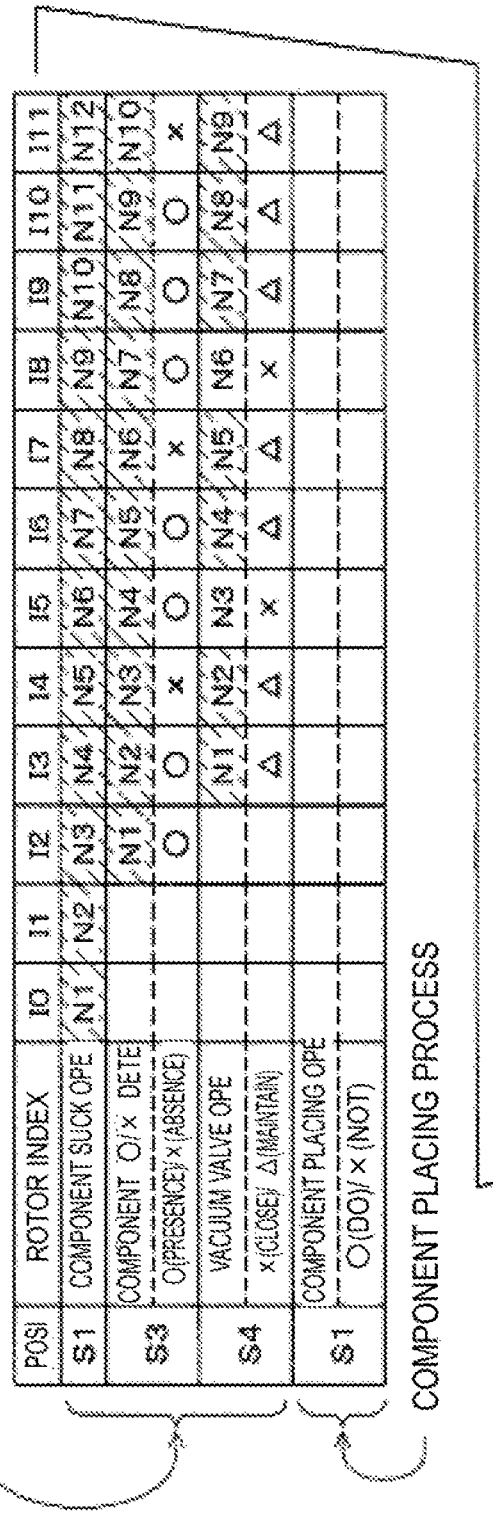

COMPONENT MOUNTER

BACKGROUND

1. Technical Field

The present disclosure relates to a component mounter in which a suction nozzle picks up a component and mounts the component on a board.

2. Description of the Related Art

In the related art, a component mounter, in which a suction nozzle provided in a placing head picks up a component from a component supplier and places the component at a predetermined placement position on a board, is known. When the component is picked up in the component mounter, the suction nozzle sucks the component having a tilted posture or is not able to suck the component in some cases.

Incidentally, a component recognition camera provided to be integral with the placing head may acquire a side image of the component sucked by the suction nozzle, and an upright or tilted state of a posture or the like or a thickness or the like of the sucked component may be determined through image recognition (for example, PTL 1). In addition, the presence or absence of a component on the suction nozzle may be determined by using side images (for example, PTL 2). Recognition of the side image is performed by a controller for image recognition to which image data of an image captured by the component recognition camera is transmitted, then image processing is performed, and the presence or absence or the upright or tilted state of a posture of the component is determined, based on the result.

CITATION LIST

Patent Literature

PTL 1: Japanese Patent No. 4331054
PTL 2: PCT International publication No. 2014/147806

SUMMARY

According to the disclosure, there is provided a component mounter that has a placing head having a plurality of suction nozzles, the component mounter including: a side imaging camera that is provided to be integral with the placing head, moves relatively with respect to the plurality of suction nozzles, and thereby images, from a side, peripheral regions of front ends of the plurality of suction nozzles, respectively, in order; a determiner that determines the presence or absence of a component sucked by the front end of the suction nozzle, based on image data obtained by the side imaging camera; and a calculator that calculates a thickness of the component sucked by the front end of the suction nozzle, based on the image data obtained by the side imaging camera.

According to the disclosure, there is provided a component mounter that has a placing head having a plurality of suction nozzles, the component mounter including: a side imaging camera that is provided to be integral with the placing head, moves relatively with respect to the plurality of suction nozzles, and thereby images, from a side, positions of front ends of the plurality of suction nozzles, respectively, in order; a determiner that determines the presence or absence of a component sucked by the front end of the suction nozzle, based on image data obtained by the side imaging camera; and a calculator that calculates a thickness of the component sucked by the front end of the suction nozzle, based on the image data obtained by the side imaging camera. In a case where the suction nozzle performs a suction operation of a component, and then the determiner determines that a component is absent on the front end of the suction nozzle, a vacuum valve that supplies a vacuum to the end of the suction nozzle is closed.

According to the disclosure, it is possible to rapidly determine the presence or absence of a component on a suction nozzle.

BRIEF DESCRIPTION OF THE DRAWINGS

FIG. 6A is a view illustrating the presence of the component, and FIG. 6B is a view illustrating the absence of the component;

FIGS. 7A and 7B are views depicting determination of the presence or absence of the component based on a contrast value, in the component mounter of the exemplary embodiment of the disclosure, FIG. 7A is a view illustrating the presence of the component, and FIG. 7B is a view illustrating the absence of the component;

FIG. 9A is a view illustrating an example, and FIG. 9B is a view illustrating another example;

FIG. 10 is a flowchart of a component mounting method in the component mounter of the exemplary embodiment of the disclosure;

FIG. 13 is a diagram depicting a flow of the component mounting method in the component mounter of the exemplary embodiment of the disclosure.

DETAILED DESCRIPTIONS

Before an exemplary embodiment of the disclosure is described, a problem in the related art is briefly described. In a case where it is not possible to suck a component when the component is picked up, a corresponding suction nozzle is in a state of a vacuum leak and it is not preferable that the state is prolonged. In particular, in a case where one vacuum source is common to a plurality of suction nozzles, there is a concern that problems will arise in that a suction force of the suction nozzles that suck the component is decreased when the number of the suction nozzles in a state of the vacuum leak is decreased, and the component drops down. Incidentally, in order to prevent this phenomenon, there is a need to prepare an appropriate countermeasure of rapid determination of the presence or absence of the component on the suction nozzle and stopping the vacuum leak, or the like.

An object of the disclosure is to provide a component mounter in which it is possible to rapidly determine the presence or absence of the component on the suction nozzle.

Figure 1:
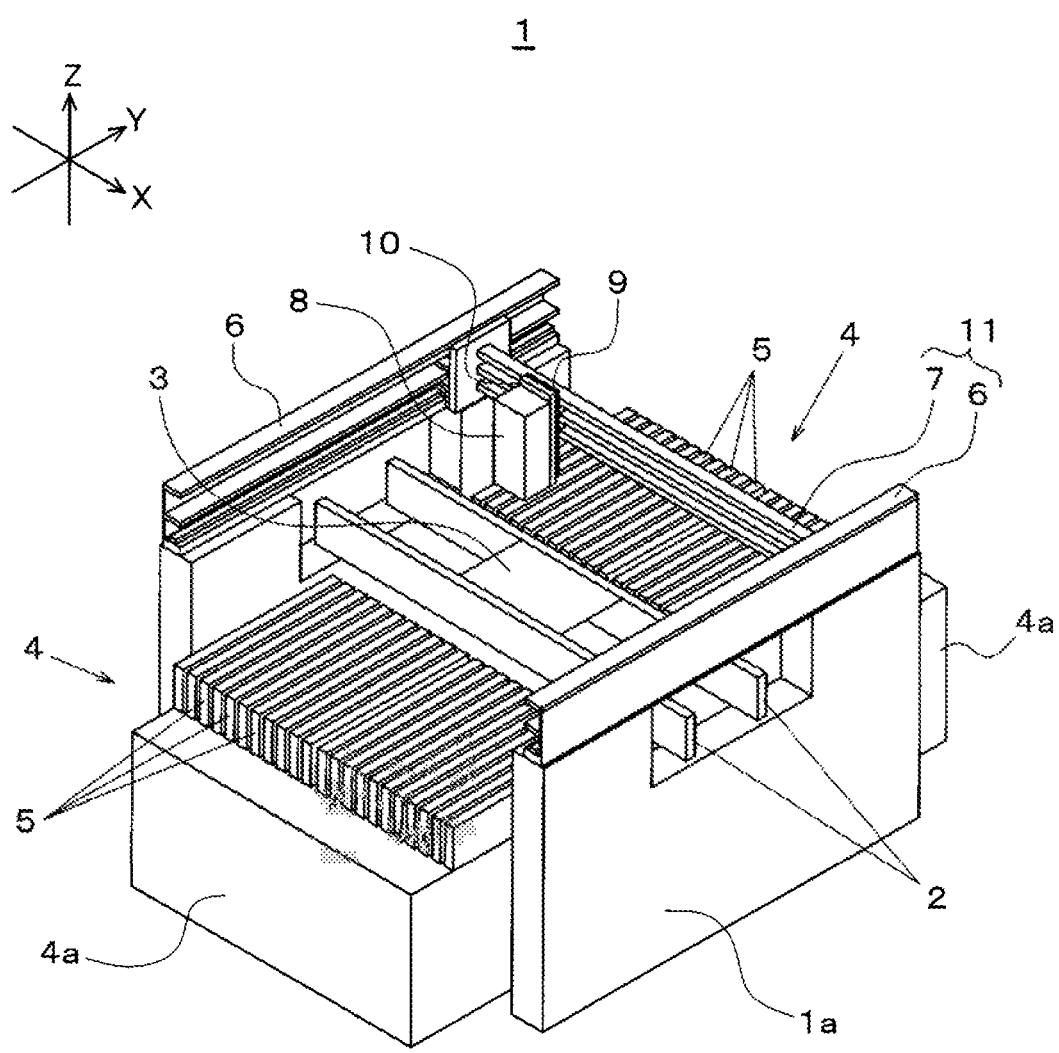
FIG. 1 is a perspective view of a component mounter of an exemplary embodiment of the disclosure.

Hereinafter, an exemplary embodiment of the disclosure will be described in detail with reference to the figures. A configuration, a shape, or the like, which will be described below, is an example for description, and can be appropriately modified according to specification of the component mounter. Hereinafter, the same reference signs are assigned to corresponding elements in all of the figures, and repeated description thereof is omitted. In FIG. 1 and a part of the following description, an X direction (perpendicular direction in FIG. 2) as a board transporting direction, and a Y direction orthogonal to the board transporting direction (rightward-leftward direction in FIG. 2) are illustrated as two axial directions which are orthogonal to each other in a horizontal plane. In FIG. 1 and a part of the following description, a Z direction (vertical direction in FIG. 2) is illustrated as a height direction orthogonal to the horizontal plane and a θ direction is illustrated as a direction in the horizontal plane which rotates around the Z direction. The Z direction is the vertical direction or an orthogonal direction in a case where the component mounter is disposed on the horizontal plane.

First, a structure of component mounter 1 is described with reference to FIG. 1. Component mounter 1 has a function of mounting a component on a board. Transport mechanism 2 provided with a pair of transport conveyers extending in the X direction is disposed at the central portion of base 1a. Transport mechanism 2 receives and transports board 3 as a component mounting target from a device on an upstream side, and, positions and holds the board at a mount working position which will be described below.

Component suppliers 4 are disposed on both sides of transport mechanism 2. Component supplier 4 is configured of a plurality of tape feeders 5 provided in parallel on feeder table 4a. Tape feeder 5 performs pitch feeding of a carrier tape in which component P (refer to FIG. 2) that is mounted on board 3 is accommodated, thereby supplying component P to a pick-up position by placing head 8 of the component placing mechanism.

Next, the component placing mechanism will be described. Y-axis beams 6 provided with a linear drive mechanism are disposed in parallel with the Y direction at end portions of base 1a in the X direction. X-axis beams 7 provided with a linear drive mechanism are installed to Y-axis beams 6 such that the X-axis beams move freely in the Y direction. X-axis beam 7 is disposed in parallel with the X direction. Plate member 9 is installed to X-axis beam 7 such that the plate member moves freely in the X direction, and placing head 8 is installed to plate member 9 via a holding frame 10.

Placing head 8 has a function of picking up, from component supplier 4, and holding component P that is mounted on board 3. The component placing mechanism is configured of placing head 8. The component placing mechanism moves horizontally in the X direction and the Y direction by the drive of Y-axis beam 6 and X-axis beam 7 and places held component P on board 3 positioned and held on transport mechanism 2. Then, head moving mechanism 11 is configured to include Y-axis beam 6 and X-axis beam 7, and causes placing head 8 to move in the horizontal plane.

Figure 2:
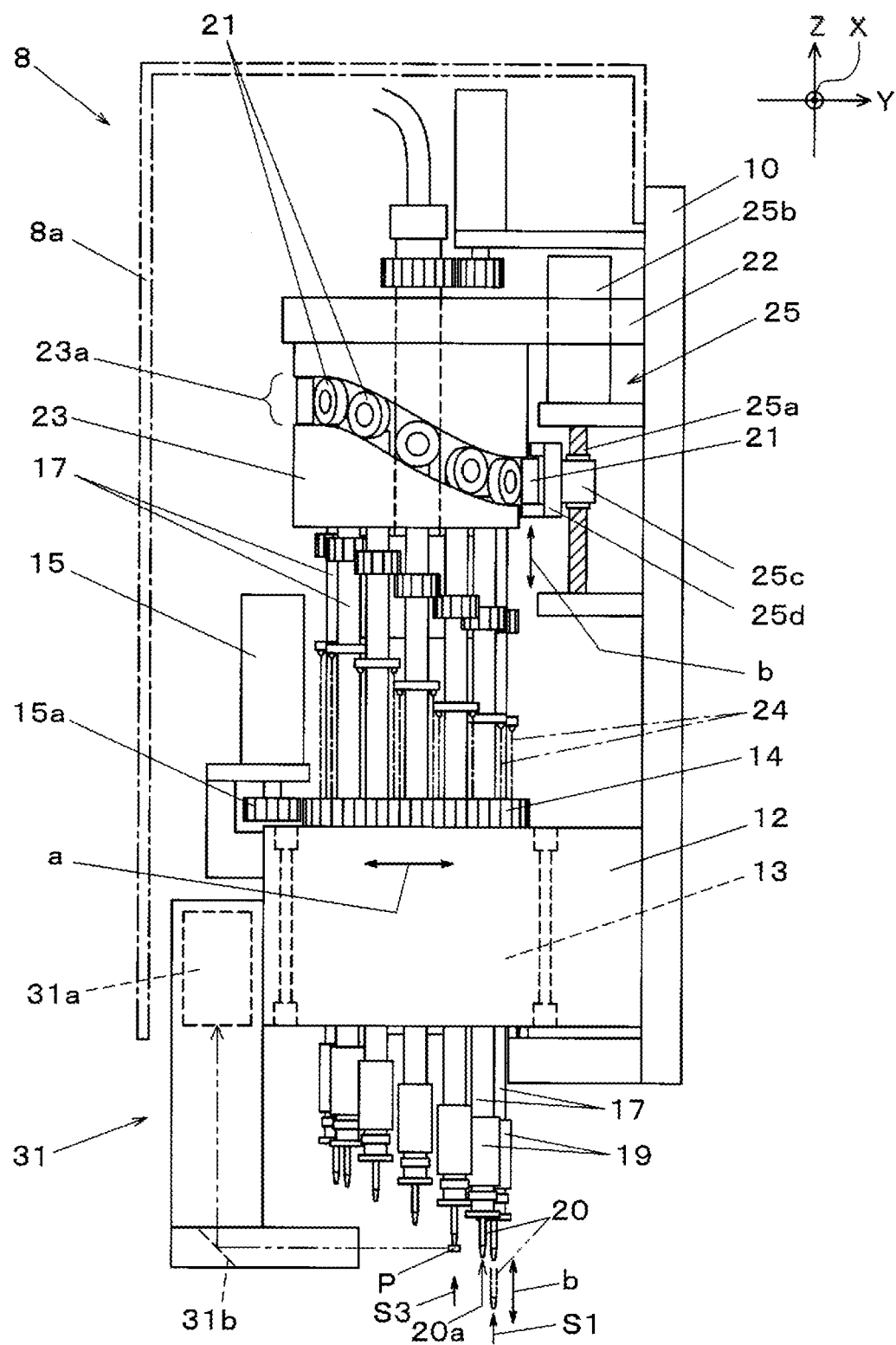
FIG. 2 is a view of a configuration of a placing head provided in the component mounter of the exemplary embodiment of the disclosure.

Next, a structure of placing head 8 is described with reference to FIGS. 2 to 4. In FIG. 2, placing head 8 has a structure in which side surfaces and the top surface of the placing head are covered with holding frame 10 and cover 8a that is fixed to holding frame 10. Rotor holder 12 is provided to extend in the horizontal direction in a lower side of holding frame 10. Circular cylindrical nozzle-shaft-holding member 13 as a rotor is held in rotor holder 12 and rotates freely around rotational axis CL in the Z direction via bearing 12a (refer to FIG. 3). Holding member following gear 14 with rotational axis CL as an axial core is firmly fixed on the top surface of nozzle-shaft-holding member 13.

Index drive motor 15 is disposed above rotor holder 12. Index driver gear 15a that meshes with holding member following gear 14 is installed to index drive motor 15. Holding member following gear 14 performs index rotation (arrow a) via index drive gear 15a through the drive of index drive motor 15. Thus, nozzle-shaft-holding member 13 also performs index rotation along with holding member following gear 14.

Figure 3:
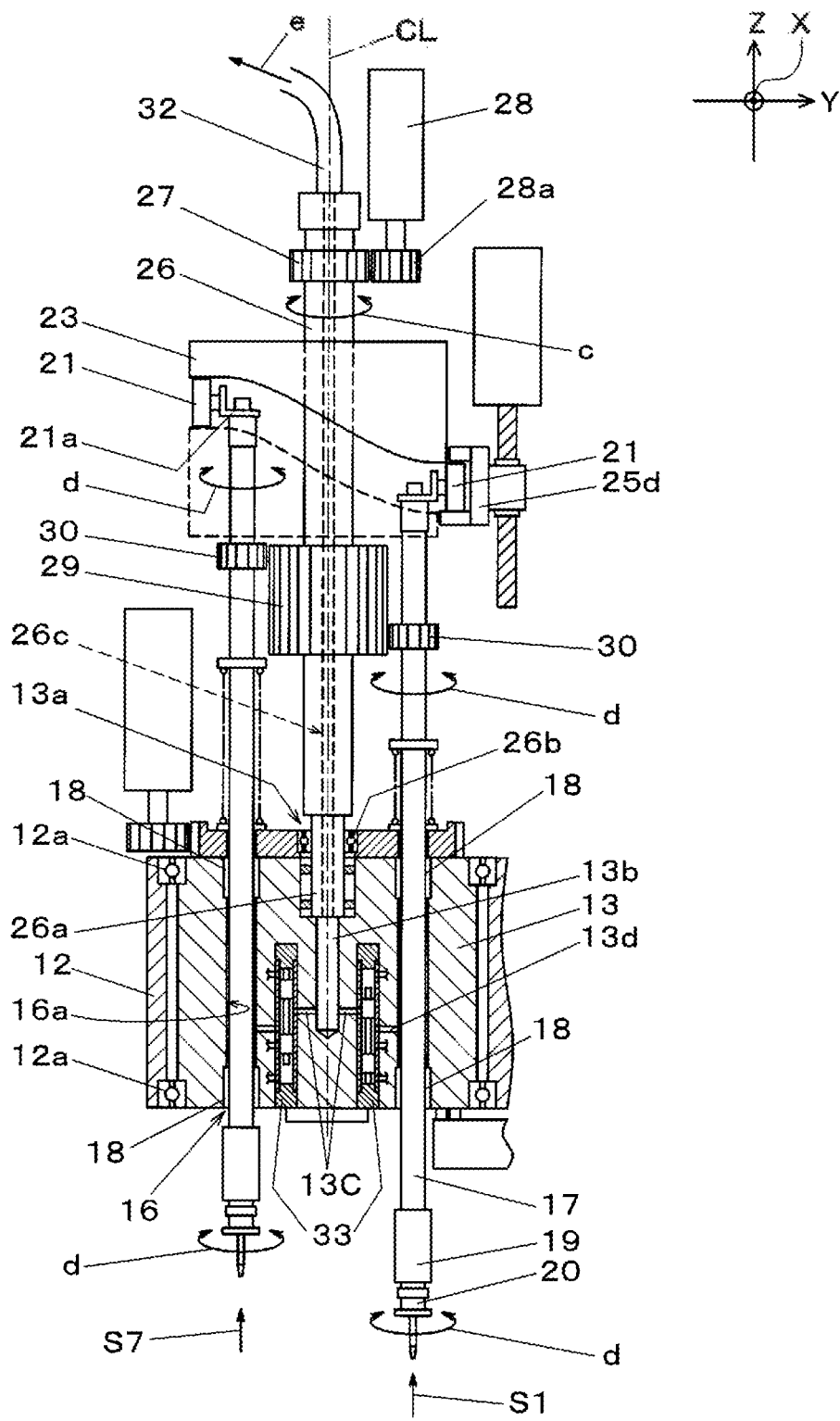
FIG. 3 is a sectional view of the placing head provided in the component mounter of the exemplary embodiment of the disclosure.
Figure 4:
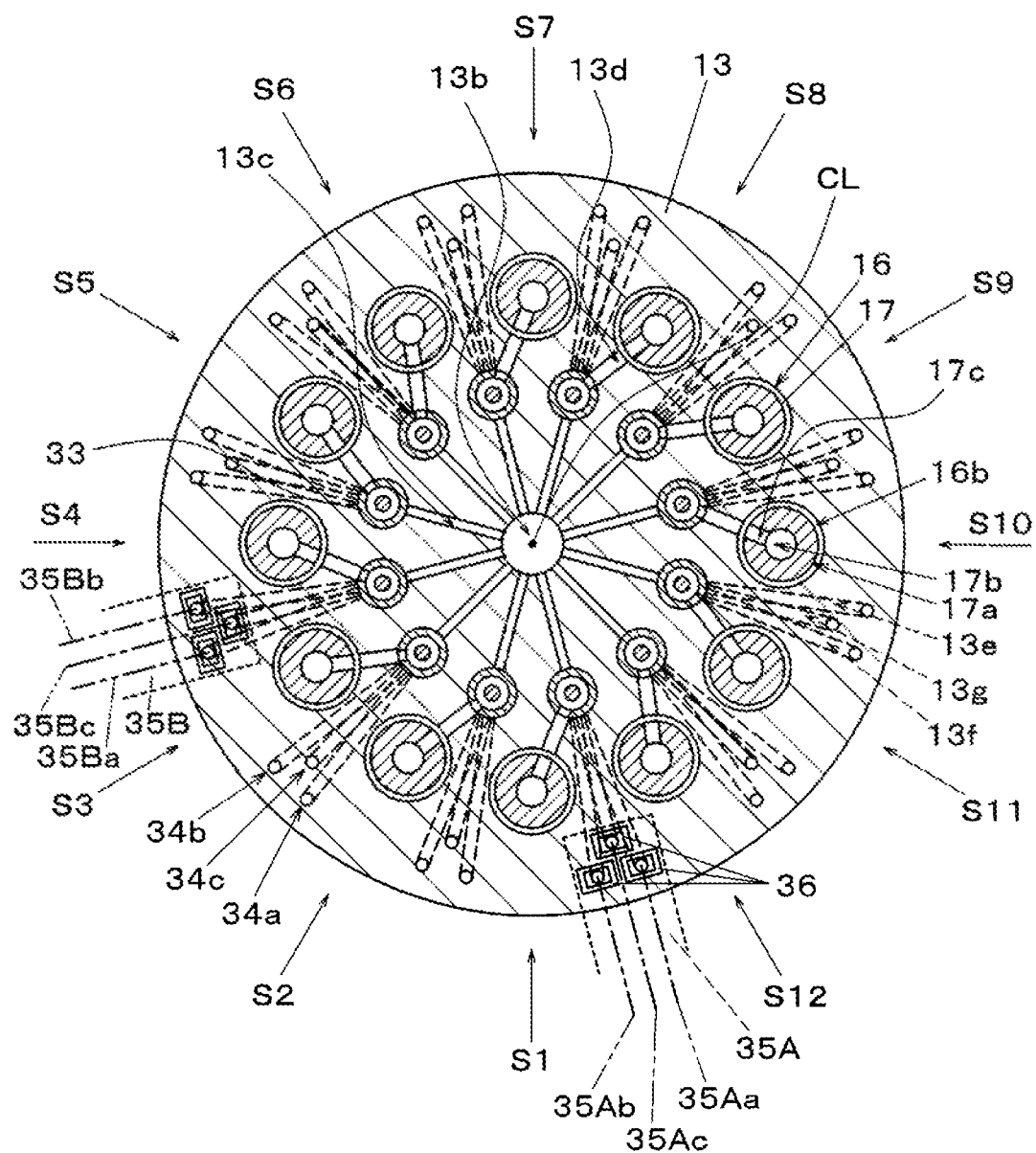
FIG. 4 is a sectional view of a part along a horizontal plane of the placing head provided in the component mounter of the exemplary embodiment of the disclosure.

FIG. 4 schematically illustrates a section along a horizontal plane of nozzle-shaft-holding member 13. In FIGS. 3 and 4, a plurality of (here, 12) through-holes 16 that vertically penetrates through nozzle-shaft-holding member 13 are provided at positions in the circumference of nozzle-shaft-holding member 13 around rotational axis CL. Circular cylindrical nozzle shafts 17 are inserted in through-holes 16, respectively, and move freely in the vertical direction with respect to nozzle-shaft-holding member 13.

In FIG. 3, bearings 18 that guide nozzle shaft 17 in the vertical direction are disposed at two positions which are separated vertically on inner circumferential surface 16a of through-hole 16. Nozzle holders 19 are provided on the lower side of nozzle shafts 17, respectively, and suction nozzles 20 are detachably installed to nozzle holders 19, respectively. In other words, placing head 8 has a plurality of (here, 12) suction nozzles 20. Substantially L-shaped attachment fastener 21a is installed on a top end portion of nozzle shaft 17 so as to rotate freely in the θ direction. Cam follower 21 is attached to attachment fastener 21a such that a rotational axis of the cam follower with the horizontal direction as an axial core faces outward.

In FIG. 2, cam holder 22, to which circular cylindrical cam 23 is fixed, is provided to extend in the horizontal direction on an upper side of holding frame 10. Groove 23a is provided in an outer circumferential surface of circular cylindrical cam 23. Groove 23a is provided to have a side opposite to holding frame 10, which is high, and to be gradually lowered as the groove is closer to holding frame 10. Cam followers 21 attached to nozzle shafts 17, respectively, are installed to circular cylindrical cam 23 so as to be movable along groove 23a.

Nozzle shafts 17 are biased upward by elastic member 24 such as a spring provided above nozzle-shaft-holding member 13. When nozzle-shaft-holding member 13 performs the index rotation, nozzle shaft 17 performs circular movement in the horizontal direction following the index rotation and, in the meanwhile, vertically moves along groove 23a of circular cylindrical cam 23. A part of circular cylindrical cam 23 is cut at a position at which groove 23a reaches the lowest point, and groove 23a is interrupted at the cut position.

Component suction nozzle lifting/lowering mechanism 25 is disposed between holding frame 10 and circular cylindrical cam 23. Component suction nozzle lifting/lowering mechanism 25 is configured to include screw shaft 25a extending in the Z direction, lifting/lowering motor 25b that drives and rotates screw shaft 25a, and nut 25c that is screwed with screw shaft 25a. Cam follower holding fastener 25d is provided on nut 25c so as to be capable of lifting and lowering along the cut position of circular cylindrical cam 23. Cam follower holding fastener 25d is lifted and lowered along with nut 25c through the drive of lifting/lowering motor 25b. Cam follower holding fastener 25d has a shape to complement groove 23a interrupted at the cut position. Hence, cam follower 21 that moves along groove 23a can smoothly moves over to cam follower holding fastener 25d.

Cam follower 21 that reaches the cut position by moving along groove 23a escapes from groove 23a at this position and moves over to and is held in cam follower holding fastener 25d that stands by at a position having the same height as groove 23a. When lifting/lowering motor 25b is driven in this state, nozzle shaft 17 and suction nozzle 20 are lifted and lowered (arrow b) along with cam follower 21 with respect to nozzle-shaft-holding member 13. Note that component suction nozzle lifting/lowering mechanism 25 is not limited to have the structure described above, and may have a structure of using a linear motor or a structure of using an air cylinder as long as nozzle shaft 17 is caused to vertically move.

In this manner, a position of nozzle shaft 17, at which cam follower holding fastener 25d holds cam follower 21, becomes first station S1 in which nozzle shaft 17 is lifted and lowered. In FIG. 4, 12 positions, at which nozzle-shaft-holding member 13 stops after performing the index rotation (here, rotation by 30 degrees), are referred to as first station S1 to n-th station Sn (n=1, 2, . . . , 12) in order in the clockwise direction. In other words, 12 suction nozzles 20, which are installed on the lower side of nozzle shaft 17 into which nozzle-shaft-holding member 13 is inserted, move from n-th station Sn to adjacent n+1 station Sn+1 whenever nozzle-shaft-holding member 13 performs the index rotation. First station S1 is next to twelfth station S12.

In FIG. 3, attachment hole 13a with rotational axis CL as the center of nozzle-shaft-holding member 13 is provided in a top surface of nozzle-shaft-holding member 13. Circular columnar rotating member 26, which vertically penetrates through circular cylindrical cam 23, has front end 26a that is fitted in attachment hole 13a via bearing 26b and thereby is disposed to freely rotate with respect to nozzle-shaft-holding member 13.

θ-rotation following gear 27 with rotational axis CL as an axial core is firmly fixed in the vicinity of the top end portion of rotating member 26. θ-rotation motor 28, in which 0-rotation drive gear 28a meshing with θ-rotation following gear 27 is installed, is disposed above circular cylindrical cam 23. θ-rotation following gear 27 rotates in the θ direction via θ-rotation drive gear 28a through the drive of θ-rotation motor 28. Thus, rotating member 26 rotates (arrow c) in the θ direction along with θ-rotation following gear 27.

Nozzle drive gear 29 elongating in the vertical direction by corresponding to a lifting/lowering stroke of nozzle shaft 17 is firmly fixed between nozzle-shaft-holding member 13 and circular cylindrical cam 23 so as to be disposed around rotating member 26. Nozzle rotating gears 30 are firmly fixed to nozzle shafts 17, respectively, so as to be disposed at a position at which the nozzle rotating gear meshes with nozzle drive gear 29. Nozzle shafts 17 rotate (arrow d) collectively in the θ direction via nozzle rotating gear 30 through the drive of nozzle drive gear 29.

In FIG. 2, side imaging camera 31 is provided in rotor holder 12, and images, from a side, a peripheral region including front end 20a of suction nozzle 20 that is stopped at third station S3 through index rotation. In a case where component P is sucked on front end 20a of suction nozzle 20, side imaging camera 31 images, from a side, the peripheral regions of front end 20a of suction nozzle 20 and component P at the same time. Whenever nozzle-shaft-holding member 13 performs the index rotation, side imaging camera 31 moves relatively and images, in order, front ends 20a of suction nozzles 20 that are stopped at third station S3.

In other words, side imaging camera 31 is provided to be integral with placing head 8, moves relatively with respect to the plurality of suction nozzles 20, and thereby images, from a side, the peripheral regions of front ends 20a of the plurality of suction nozzles 20, respectively, in order. Side imaging camera 31 is configured to include camera 31a that images suction nozzle 20 and mirror 31b that guides an image of suction nozzle 20 to camera 31a. When a component is placed on board 3, placement height correction is performed to correct a lowering position (placement height of component P) of nozzle shaft 17 by using a recognition result of component P sucked by suction nozzle 20, which is obtained by side imaging camera 31.

Figure 8:
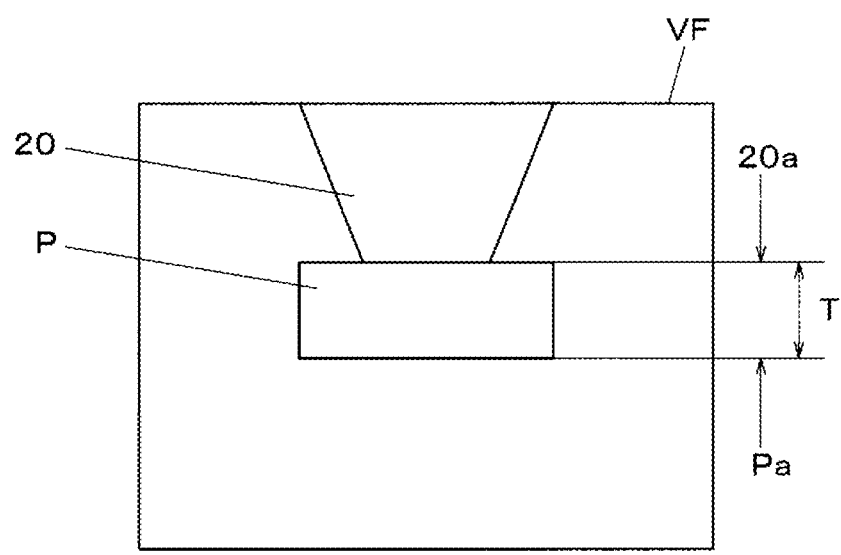
FIG. 8 is a view depicting a thickness of the component, which is calculated in the component mounter of the exemplary embodiment of the disclosure.

Next, an airflow path of placing head 8 will be described with reference to FIGS. 8 and 4. In FIG. 3, a common flow path 13b is provided inside nozzle-shaft-holding member 13 so as to be open to a top plane of attachment hole 13a provided at the center in the top of nozzle-shaft-holding member 13 and so as to be provided in a longitudinal direction along rotational axis CL. Common flow path 13b communicates with rotating-member-inner hole 26c provided inside rotating member 26 that is fitted in attachment hole 13a. Rotating-member-inner hole 26c communicates (arrow e) with a negative pressure generating source (not illustrated) via tube 32 connected to the top end of rotating member 26.

In FIG. 4, valve units 33 (here, 12 units) are disposed between common flow path 13b and through-holes 16 inside nozzle-shaft-holding member 13, respectively. Valve units 33 communicate with common flow path 13b via holding-member-transverse holes 13c formed inside nozzle-shaft-holding member 13. In addition, valve units 33 communicate with front ends 20a of suction nozzles 20, respectively, via connection hole 13d formed inside nozzle-shaft-holding member 13, communication gap 16b of through-holes 16, opening 17c that penetrates and is opened through outer circumferential surface 17a of nozzle shaft 17, inter-shaft hole 17b inside nozzle shaft 17, and inter-nozzle holes provided inside suction nozzles 20.

In addition, valve units 33 communicate with upper connection port 34a, lower connection port 34b, and positive pressure connection port 34c formed in the bottom of nozzle-shaft-holding member 13 via upper connection tube path 13e, lower connection tube path 13f, and positive pressure connection tube path 13g, respectively, which are formed inside nozzle-shaft-holding member 13. Air suppliers 35A and 35B are disposed on the lower side of nozzleshaft-holding member 13 at first station S1 and fourth station S4, respectively. When nozzle-shaft-holding member 13 performs the index rotation and stops at first station S1, upper connection port 34a, lower connection port 34b, and positive pressure connection port 34c of nozzle shaft 17 are connected to upper supply path 35Aa, lower supply path 35Ab, and positive pressure supply path 35Ac of air supply path 35A via pads 36, respectively.

Upper connection port 34a, lower connection port 34b, and positive pressure connection port 34c of nozzle shaft 17 stopped at fourth station S4 are connected to upper supply path 35Ba, lower supply path 35Bb, and positive pressure supply path 35Bc of air supply path 35B via pads 36, respectively. Each of upper supply paths 35Aa and 35Ba and lower supply paths 35Ab and 35Bb communicates with positive pressure generating source (not illustrated) via on-off valve V (refer to FIG. 5). Control of on-off valve V enables positive pressure to be supplied, at a predetermined timing, individually to upper supply paths 35Aa and 35Ba and lower supply paths 36Ab and 35Bb. Normally, the atmospheric pressure is supplied to positive pressure supply paths 35Ac and 35Bc.

In FIG. 4, valve units 33 have a function of switching and setting, by switching inner paths by the positive pressure that is supplied from upper connection port 34a and lower connection port 34b, a "negative pressure supply state" in which the negative pressure is supplied to connection hole 13d from common flow path 13b, or "atmospheric pressure supply state" in which the atmospheric pressure supplied from positive pressure supply paths 35Ac and 35Bc is supplied to connection hole 13d. In the "negative pressure supply state", the negative pressure is supplied to front end 20a of suction nozzle 20 such that it is possible for component P to be sucked on front end 20a. In other words, valve unit 33 is a vacuum valve that starts and stops the supply of a vacuum to front end 20a of suction nozzle 20.

In the "atmospheric pressure supply state", the atmospheric pressure is supplied to front end 20a of suction nozzle 20. In addition, since a path is blocked between common flow path 13b and connection hole 13d in the "atmospheric pressure supply state", the atmosphere does not flow in (vacuum-leak from) common flow path 13b from front end 20a of suction nozzle 20. In addition, when the supply of the positive pressure to lower port 33b or upper port 33a is stopped, valve unit 33 is to maintain the "negative pressure supply state" or the "atmospheric pressure supply state".

For example, valve unit 33 is set to the "negative pressure supply state" at first station S1 and component P is sucked by suction nozzle 20 of nozzle shaft 17. In this state, nozzle shaft 17 can continuously hold component P even when nozzle-shaft-holding member 13 performs the index rotation and departs from first station S1. In addition, in a state in which valve unit 33 is set to the "atmospheric pressure supply state" at fourth station S4, nozzle shaft 17 is maintained in the state in which the path to the negative pressure generating source is blocked even when nozzle-shaft-holding member 13 performs the index rotation and departs from fourth station S4.

Next, a structure of a control system of component mounter 1 will be described with reference to FIG. 5. Control device 40 provided in component mounter 1 is an arithmetic processing unit having a function of a CPU. Control device 40 includes mechanism controller 41, device storage 42, camera instruction issuer 43, thickness calculator 44, processing range setter 45, component suction processor 46, component placing processor 47, and display processor 48. Device storage 42 stores determination result data 42a, secondary image data 42b, thickness data 42c, or the like, as well as a mount working parameter required for control of respective members by mechanism controller 41. Mechanism controller 41 controls an operation of transport mechanism 2 such that the transport mechanism 2 transports board 3 and positions and holds the board at a mount working position. The mechanism controller controls an operation of tape feeder 5 such that the tape feeder supplies component P to a component picking-up position.

In addition, mechanism controller 41 controls an operation of head moving mechanism 11 such that placing head 8 moves within a horizontal plane. In addition, mechanism controller 41 controls operations of index drive motor 15, lifting/lowering motor 25b, and θ-rotation motor 28 such that nozzle-shaft-holding member 13 performs the index rotation, nozzle shaft 17 positioned at first station S1 is lifted or lowered, and nozzle shafts 17 collectively perform θ-rotation. In addition, mechanism controller 41 controls an operation of on-off valve V such that valve units 33 positioned at first station S1 and fourth station S4 are set to the "negative pressure supply state" or the "atmospheric pressure supply state".

Figure 5:
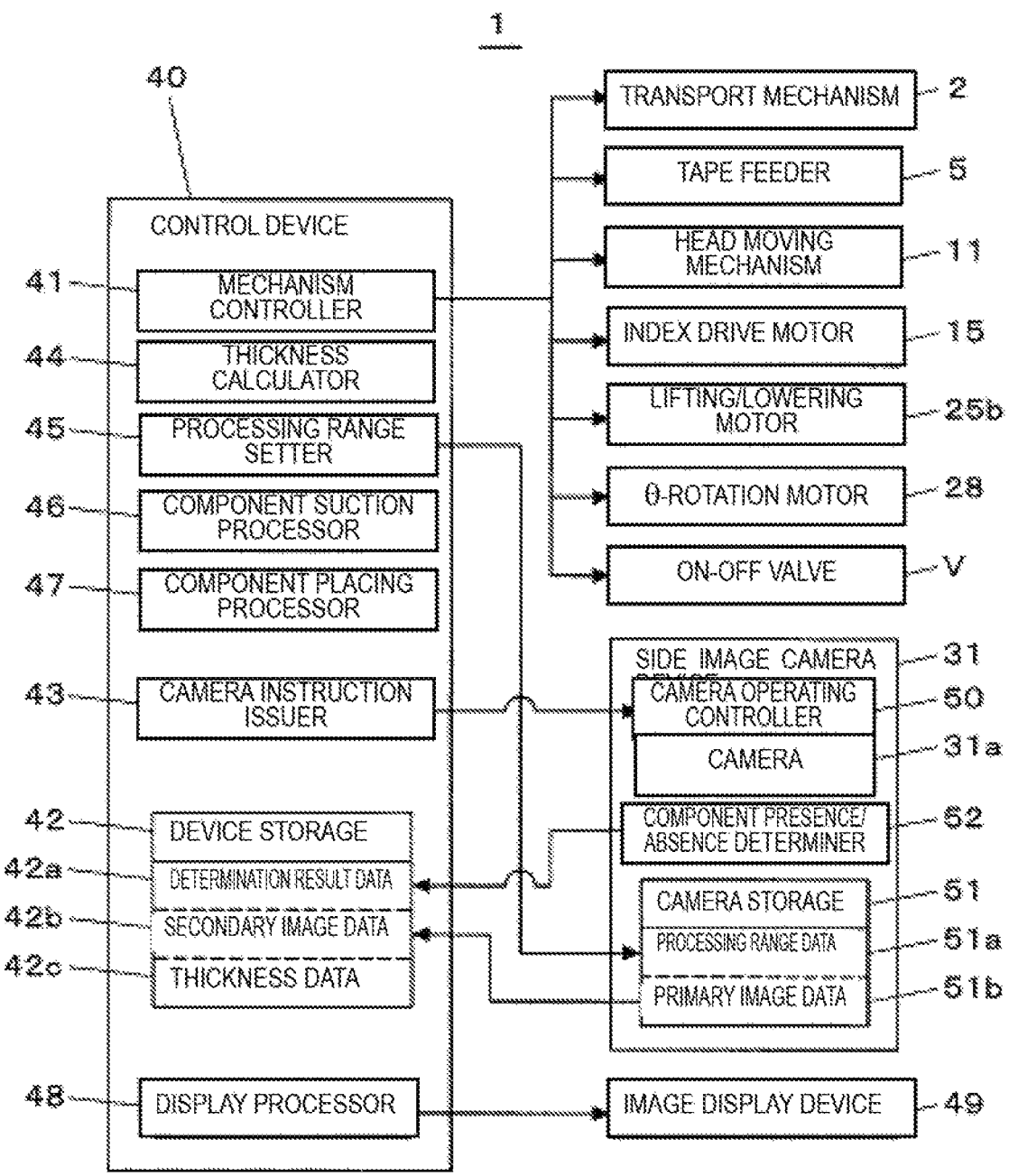
FIG. 5 is a block diagram illustrating a configuration of a control system of the component mounter of the exemplary embodiment of the disclosure.

In FIG. 5, camera instruction issuer 43 issues instructions of various types of processing to side imaging camera 31. Side imaging camera 31 includes camera operation controller 60, camera storage 51, and component presence/absence determiner 52, as well as camera 31a that captures an image. Camera operation controller 50 receives an instruction from camera instruction issuer 43 and captures, by camera 31a, an image of front end 20a of suction nozzle 20 positioned at third station S3. Camera storage 51 stores processing range data 51a and primary image data 51b.

After the image captured by camera 31a is temporarily stored as primary image data 51b in camera storage 51, the image is transmitted to control device 40, is associated with captured suction nozzle 20, and is stored as secondary image data 42b in device storage 42. Component presence/absence determiner 52 executes a component presence/absence determining process of determining presence or absence of component P sucked on front end 20a of suction nozzle 20, based on the data of the image captured by camera 31a. The determination result is transmitted to control device 40, is associated with suction nozzle 20 subjected to the determination, and is stored as determination result data 42a in device storage 42. In other words, component presence/absence determiner 52 is a determiner that determines the presence or absence of component P sucked by front end 20a of suction nozzle 20, based on the image data obtained by side imaging camera 31.

Component presence/absence determiner 52 is provided in side imaging camera 31 or placing head 8. In other words, component presence/absence determiner 52 (determiner) is a controller provided in placing head 8 or side imaging camera 31. Then, component presence/absence determiner 52 determines the presence or absence of component P based on the image data while camera 31a captures an image which becomes primary image data 51b. In other words, since the determination of the presence or absence of component P by component presence/absence determiner 52 is completed before acquired primary image data 51b is transmitted to control device 40, the determination can be more rapidly executed than the same determination that is determined in control device 40.

Figure 6A:
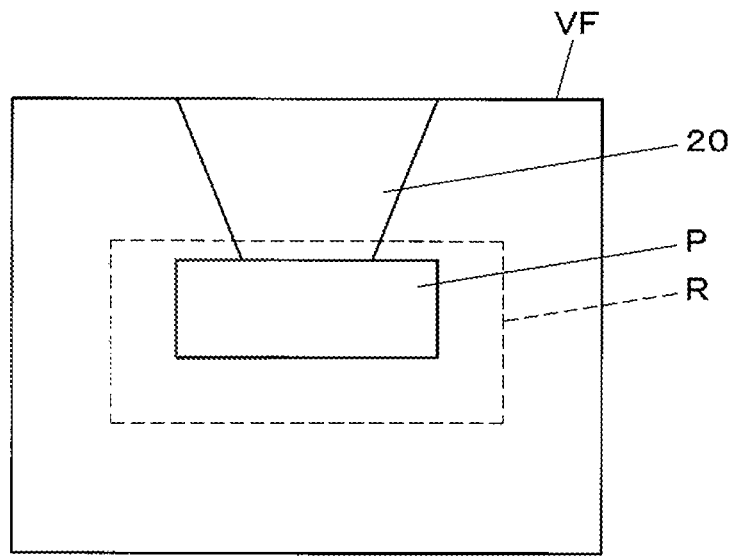
FIGS. 6A and 6B are views depicting determination of the presence or absence of a component based on an average luminance value, in the component mounter of the exemplary embodiment of the disclosure.
Figure 6B:
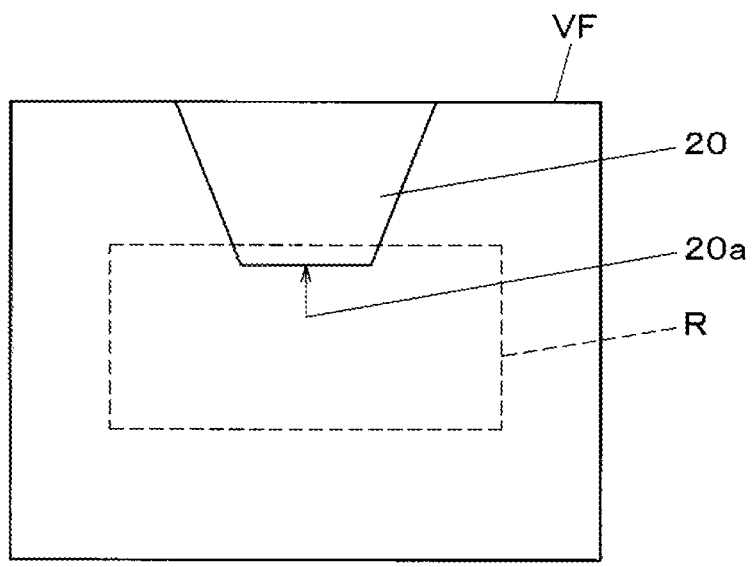

Here, the component presence/absence determining process is described with reference to FIGS. 6A to 7B. In the component presence/absence determining process, an image is determined based on an average luminance value and a contrast value. First, the component presence/absence determining process based on the average luminance value is described with reference to FIGS. 6A and 6B. FIG. 6A illustrates an image having imaging visual field VF of component-present suction nozzle 20, on which component P is sucked and which is captured by side imaging camera 31. FIG. 6B illustrates an image having imaging visual field VF of component-absent suction nozzle 20, on which component P is not sucked and which is captured by side imaging camera 31. Rectangular processing range R illustrated in a dotted line is set within the image having imaging visual field VF. Processing range R is stored as a coordinate of four vertices of the rectangular shape in imaging visual field VF, in processing range data 51a.

A region, in which component P is present, on the image captured by side imaging camera 31 has high luminance due to light reflected from component P. Therefore, in the case where the component is present as illustrated in FIG. 6A, the average luminance value of processing range R becomes high (bright). Meanwhile, in the case where the component is not sucked as illustrated in FIG. 6B, the average luminance value of processing range R becomes low (dark). When image data of entire processing range R is obtained while camera 31a captures images which become primary image data 51b, component presence/absence determiner 52 calculates an average luminance value of processing range R, determines that a component is present in a case where the average luminance value is higher than a predetermined value, and determines that a component is absent in a case where the average luminance value is lower than the predetermined value. In this manner, component presence/absence determiner 52 (determiner) determines the presence or absence of component P, based on the average luminance value of processing range R set in the image data in advance.

Note that the case where recognition is performed through the reflection method is described above; however, in a case where recognition is performed due to illumination in a transmission method, the average luminance value of processing range R becomes lower (dark) in the case where the component is present, and the average luminance value of processing range R becomes higher (bright) in the case where the component is absent. Also in this case, component presence/absence determiner 52 (determiner) determines the presence or absence of component P, based on the average luminance value of processing range R set in the image data in advance.

Next, the component presence/absence determining process based on the contrast value will be described with reference to FIGS. 7A and 7B. FIG. 7A illustrates an image having imaging visual field VF of suction nozzle 20 captured by side imaging camera 31 in the case of the presence of the component and FIG. 7B illustrates an image captured in the case of the absence of the component. Similar to FIGS. 6A and 6B, rectangular processing range R illustrated in a dotted line is set on the image having imaging visual field VF. Camera 31a scans the uppermost row from left to right, then scans from left to right while moves downward by one row in order, and performs imaging. Pixel IE of processing range R has high luminance (brightness) at a position at which component P is present and has low luminance (darkness) at a position at which component P is absent.

In a case where the component is present as illustrated in FIG. 7A, a predetermined number of pixels IE having high luminance continuously appear on component P. In a case where the component is absent as illustrated in FIG. 7B, pixels IE having high luminance do not continuously appear.

In other words, a difference in luminance (contrast) is produced on scanning line SL in the case where component P is present and a difference in luminance is not produced in the case where component P is absent. While camera 31a captures an image as primary image data 51b, component presence/absence determiner 62 measures luminance of pixel IE on scanning line SL in processing range R, determines that a component is present when the contrast (difference in luminance) having a value equal to or higher than a predetermined value is produced, and determines that a component is absent when the contrast having a value equal to or higher than the predetermined value is not produced. In this manner, component presence/absence determiner 52 (determiner) determines the presence or absence of component P, based on the contrast value of processing range R set in the image data in advance.

Note that, as described above, in the case where recognition is performed due to illumination in a transmission method, a luminance value becomes lower (dark) in the case where the component is present, and the luminance value becomes higher (bright) in the case where the component is absent. Also in this case, component presence/absence determiner 52 (determiner) determines the presence or absence of component P, based on the contrast value of processing range R set in the image data in advance.

In FIG. 5, thickness calculator 44 performs image processing on secondary image data 42b stored in device storage 42 to which primary image data 51b is transmitted, and executes a thickness calculating process of calculating thickness T of component P sucked on front end 20a of suction nozzle 20. In other words, thickness calculator 44 is a calculator that calculates thickness T of component P sucked on front end 20a of suction nozzle 20, based on secondary image data 42b (image data) obtained by side imaging camera 31. Here, thickness T of the component is described with reference to secondary image data 42b illustrated in FIG. 8. Thickness calculator 44 recognizes, through image processing, a position of front end 20a of suction nozzle 20 and a position of underside Pa of sucked component P, calculates a difference between both positions as thickness T of component P.

Calculated thickness T of component P is associated with captured suction nozzle 20 and is stored as thickness data 42c in device storage 42. In this manner, thickness calculator 44 (calculator) is a controller provided in a main body of component mounter 1, and the determination of the presence or absence of component P in component presence/absence determiner 52 (determiner) and the calculation of thickness T of component P in thickness calculator 44 (calculator) are performed, based on the same image data (primary image data 51b and secondary image data 42b).

Figure 9A:
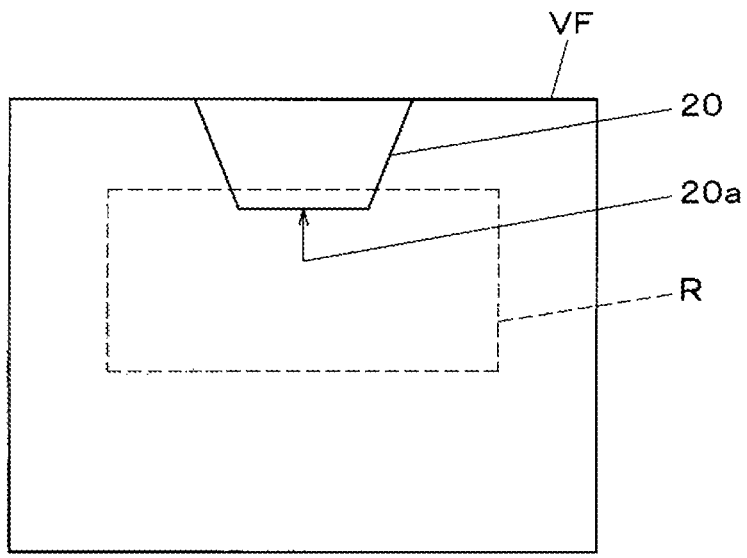
FIGS. 9A and 9B are views depicting a determination range which is used in a component suction process in the component mounter of the exemplary embodiment of the disclosure.
Figure 9B:
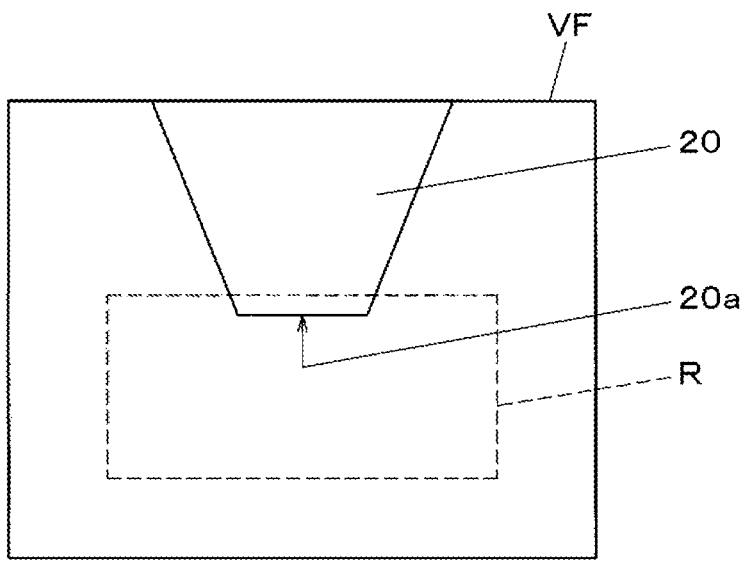

Processing range setter 45 executes the processing range setting process of determining processing range R, which is used in the component presence/absence determining process, for each of the plurality of (here, 12) suction nozzles 20 provided in placing head 8. Processing range setter 45 causes nozzle-shaft-holding member 13 to perform the index rotation, causes suction nozzles 20, on which component P is not sucked, to position at third station S3 in order, and causes side imaging camera 31 to capture an image including front end 20a of suction nozzle 20. FIGS. 9A and 9B illustrate examples of data of captured images. Processing range setter 45 performs the image processing on the obtained image data, recognizes the position of front end 20a of suction nozzle 20, and sets, as processing range R, a predetermined range including recognized front end 20a of suction nozzle 20.

As illustrated in FIGS. 9A and 9B, the position of front end 20a of suction nozzle 20 varies for each suction nozzle 20 because of various factors produced due to a manufacture error of suction nozzle 20, an installation error of suction nozzle 20 to nozzle holder 19, or the like. FIG. 9A illustrates an example in which front end 20a of suction nozzle 20 is disposed at a high position in imaging visual field VF, and FIG. 9B illustrates an example in which front end 20a of suction nozzle 20 is disposed at a low position in imaging visual field VF. Processing range setter 45 set processing ranges R for all of suction nozzles 20 installed in placing head 8, and causes camera storage 51 to store the processing ranges as processing range data 51a associated with suction nozzle 20. In other words, processing range R set in the image data in advance is set for each of the plurality of suction nozzles 20, based on the image data obtained in the state in which component P is absent on suction nozzle 20.

In FIG. 5, component suction processor 46 controls tape feeder 5, head moving mechanism 11, index drive motor 15, lifting/lowering motor 25b, θ-rotation motor 28, and on-off valve V so as to control component suction processes of picking up, by suction nozzles 20 positioned at first station S1 in order, components P supplied at the picking-up position on tape feeder 5.

Component placing processor 47 controls head moving mechanism 11, index drive motor 15, lifting/lowering motor 25b, and θ-rotation motor 28 so as to control component placing processes of placing components P, which is sucked by suction nozzle 20, at a predetermined placement position on boards 3 positioned and held at a component mount working position in order. Component placing processor 47 places component P by correcting an amount of lowering (placement height of component P) of suction nozzle 20, based on thickness data 42c stored in device storage 42, in the component placing process. Display processor 48 causes image display device 49 such as a monitor, which is connected to control device 40, to display information required for operations of component mounter 1, secondary image data 42b obtained by the capturing of side imaging camera 31.

Next, a component mounting method in component mounter 1 will be described with reference to FIGS. 10 to 13. In FIG. 10, processing range setter 45 causes suction nozzles 20, on which component P is not sucked, to position at third station S3 in order, and causes side imaging camera 31 to capture an image including front end 20a of suction nozzle 20. Then, processing range setter 45 executes the processing range setting process of setting processing range R for each suction nozzle 20, based on the captured image data (ST1: processing range determining step). Set processing range R is stored as processing range data 51a in camera storage 51.

Figure 12:
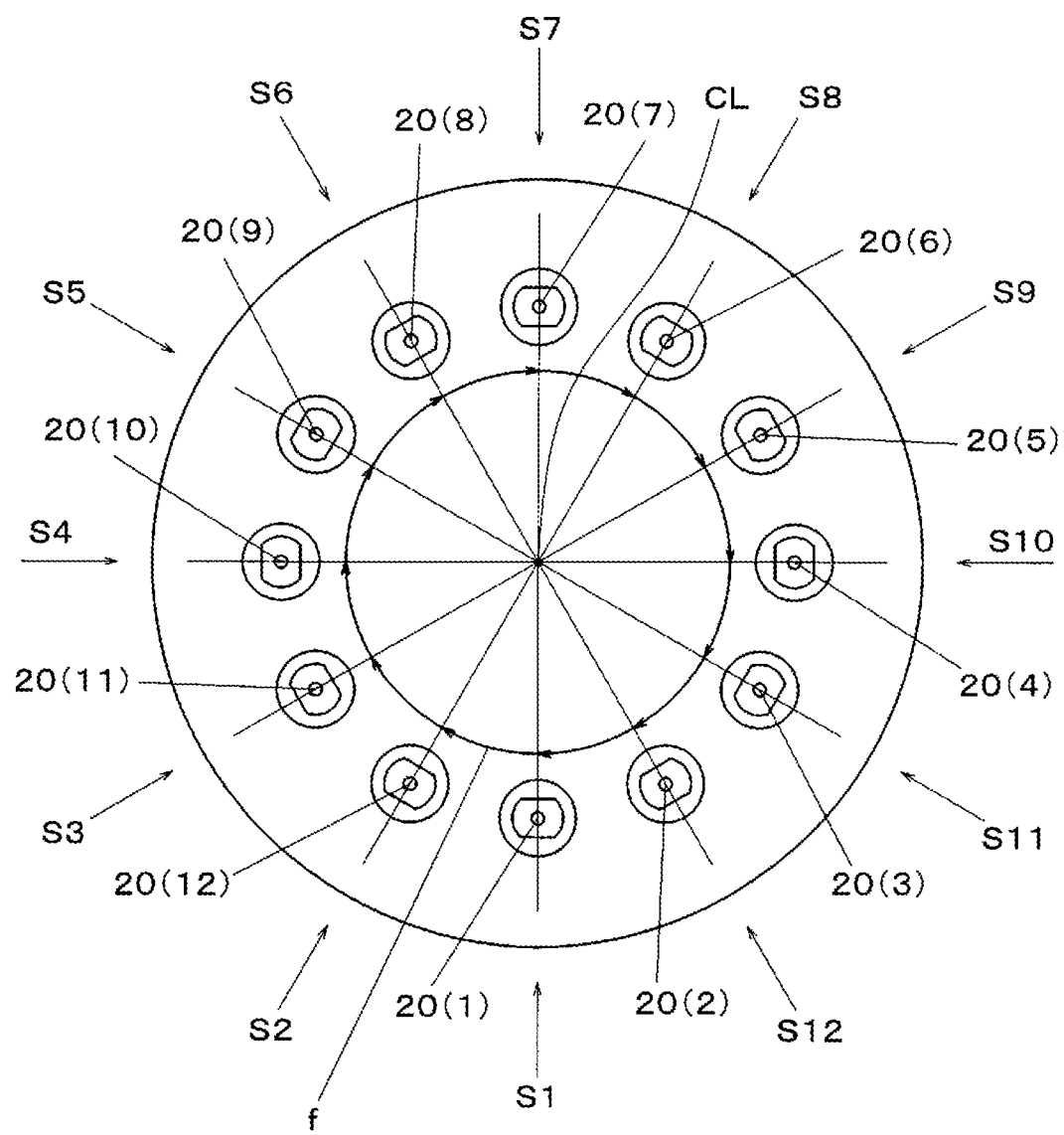
FIG. 12 is a schematic view of a nozzle-shaft-holding member, which depicts the component mounting method in the component mounter of the exemplary embodiment of the disclosure.

Subsequently, component suction processor 46 causes nozzle-shaft-holding member 13 (rotor) to perform the index rotation of 30 degrees (ST2: first index rotation step). FIG. 12 illustrates a state shown at this time. In FIG. 12, suction nozzle 20 positioned at first station S1 is defined as first suction nozzle 20(1), and the other suction nozzles 20 are defined as second suction nozzle 20(2) to twelfth suction nozzle 20(12) in the counterclockwise direction. Nozzle-shaft-holding member 13 rotates (arrow D by 30 degrees in the clockwise direction whenever the index rotation is performed. In addition, the state illustrated in FIG. 12 is defined as rotor index I0 in FIG. 13. and, for convenience, in FIG. 13, N1 represents first suction nozzle 20(1).

Figure 11:
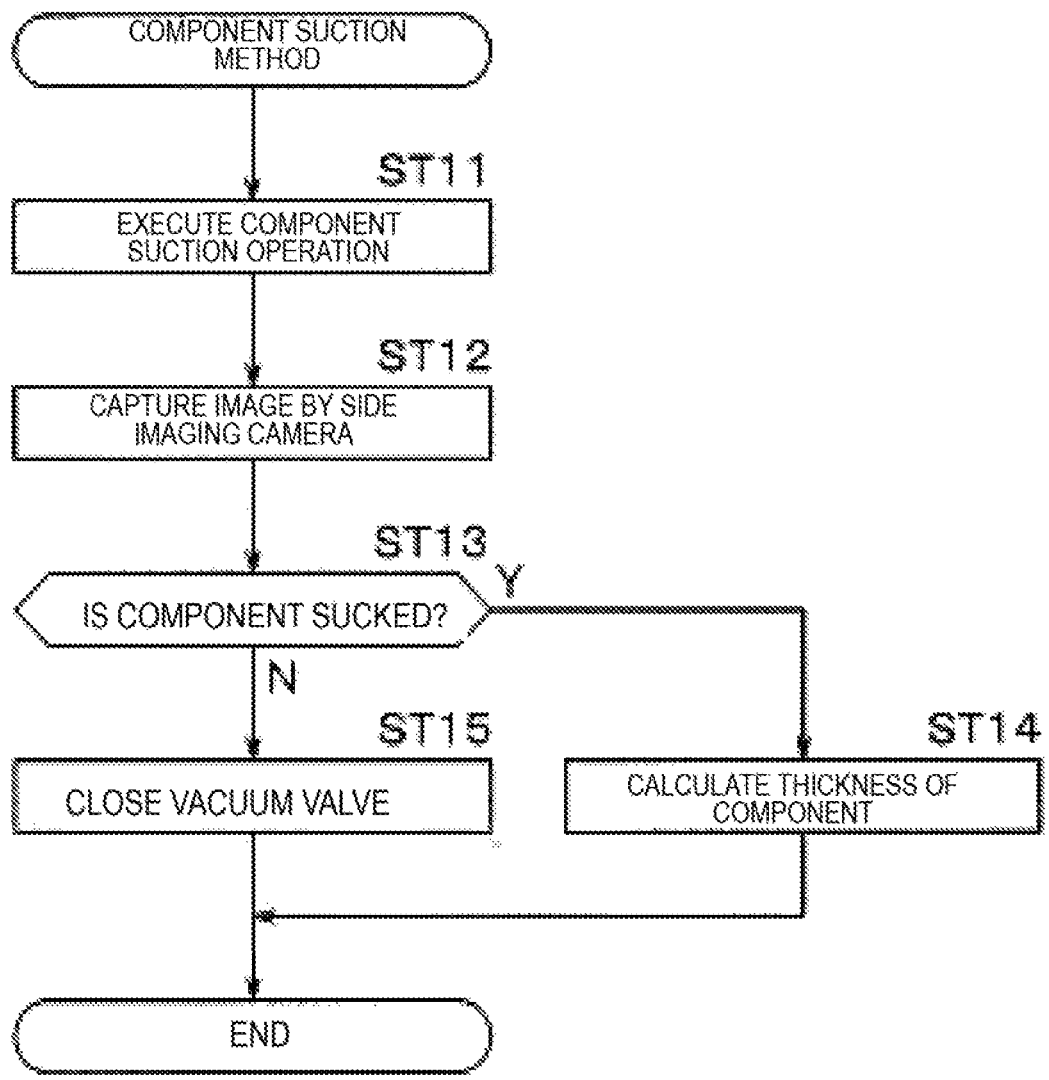
FIG. 11 is a flowchart of the component suction process in the component mounter of the exemplary embodiment of the disclosure.

In FIG. 10, subsequently, component suction processor 46 executes the component suction process (ST3: component suction process step). Next, the component suction process step (ST3) will be described in detail with reference to FIG. 11. In FIG. 11, first, component suction processor 46 causes first suction nozzle 20(1), which is positioned at first station S1, to suck component P that is supplied by tape feeder 5 (ST11: component suction step). At this time, valve unit 33 of first suction nozzle 20(1) is set to the "negative pressure supply state", and thus a vacuum is supplied to front end 20a of first suction nozzle 20(1). In FIG. 13, diagonal hatched lines are assigned to suction nozzle 20 in the "negative pressure supply state".

Subsequently, component suction processor 46 causes nozzle-shaft-holding member 13 to perform the index rotation (ST2). In this respect, the nozzle-shaft-holding member is in a state of rotor index I1 illustrated in FIG. 13, first suction nozzle 20(1) moves to second station S2, and second suction nozzle 20(2) is positioned at first station S1. Subsequently, component suction processor 46 causes second suction nozzle 20(2) to suck component P (ST11). Thus, a vacuum is supplied to front end 20a of second suction nozzle 20(2).

Subsequently, component suction processor 46 causes nozzle-shaft-holding member 13 to perform the index rotation (ST2). In this respect, the nozzle-shaft-holding member is in a state of rotor index I2 illustrated in FIG. 13, first suction nozzle 20(1) moves to third station S3, second suction nozzle 20(2) moves to second station S2, and third suction nozzle 20(3) is positioned at first station S1. Subsequently, component suction processor 46 causes third suction nozzle 20(3) to suck component P (ST11). Thus, a vacuum is supplied to front end 20a of third suction nozzle 20(3).

In FIG. 11, component presence/absence determiner 52 executes the component presence/absence determining process (ST13: component presence/absence determining step) of determining whether or not first suction nozzle 20(1) sucks component P by imaging first suction nozzle 20(1) by side imaging camera 31. (ST12), as well as the component suction step (ST11). When it is determined that first suction nozzle 20(1) sucks component P (Yes in ST13), thickness calculator 44 executes the thickness calculating process (ST14: thickness calculating step) of calculating thickness T of component P, which is sucked by first suction nozzle 20(1), based on secondary image data 42b.

In other words, in component mounter 1, after first suction nozzle 20(1) performs a suction operation of component P (ST11), thickness calculator 44 (calculator) calculates thickness T of component P that is sucked by first suction nozzle 20(1) (ST14) in a case where component presence/absence determiner 52 (determiner) determines that component P is present on front end 20a of first suction nozzle 20(1) (Yes in ST13).

When side imaging camera 31 acquires primary image data 51b, component suction processor 46 executes the next first index rotation step (ST2) in a case where it is possible to execute the first index rotation step (ST2), even before the thickness calculating step (ST14) is not completed. In other words, the thickness calculating step (ST14), first index rotation step (ST2), component suction step (ST11), and capturing (ST12) by side image camera 31 are all together executed.

Hereinafter, while the component suction process is not completed by all of suction nozzles 20 (No in ST4), first index rotation step (ST2) and component suction process step (ST3) are repeatedly executed. In other words, in FIG. 13, in rotor index I3, component suction processor 46 causes fourth suction nozzle 20(4) to suck component P (ST11), and component presence/absence determiner 52 determines whether or not second suction nozzle 20(2) suctions component P (ST13).

In FIG. 13, in rotor index I4, it is determined in the component presence/absence determining process that component P is not sucked on third suction nozzle 20(3) (No in ST13). In this case, in rotor index I5 in which third suction nozzle 20(3) moves to fourth station S4, component suction processor 46 switches valve unit 33 of third suction nozzle 20(3) from the "negative pressure supply state" to the "atmospheric pressure supply state". In other words, component suction processor 46 closes the vacuum valve (valve unit 33) that supplies a vacuum to front end 20a of third suction nozzle 20(3) (ST15: vacuum valve closing step).

In other words, after third suction nozzle 20(3) performs the suction operation of component P (ST11), the vacuum valve (valve unit 33) that supplies the vacuum to front end 20a of third suction nozzle 20(3) is closed, in a case where component presence/absence determiner 52 (determiner) determines that component P is absent on front end 20a of third suction nozzle 20(3) (No in ST13). Thus, it is possible to prevent a problem in which vacuum leak (inflow of atmosphere) occurs from front end 20a of third suction nozzle 20(3) on which component P is not sucked, thus a pressure in common flow path 13b is increased, and component P is dropped from first suction nozzle 20(1) or the like, on which component p is sucked, due to reduction of a suction force.

In addition, in a case where it is determined in the component presence/absence determining process that component P is not sucked on third suction nozzle 20(3) (No in ST13), thickness calculator 44 does not execute the thickness calculating process for third suction nozzle 20(3). In other words, after third suction nozzle 20(3) performs the suction operation of component P (ST11), the vacuum valve (valve unit 33) is closed and thickness calculator 44 (calculator) stops calculating thickness T of component P on third suction nozzle 20(3) (the thickness calculating process is not executed) in a case where component presence/absence determiner 52 (determiner) determines that component P is absent on front end 20a of third suction nozzle 20(3) (No in ST13).

Thus, thickness calculator 44 can cancel the thickness calculating process for third suction nozzle 20(3) and can start a thickness calculating process for fourth suction nozzle 20(4) early. In the example in FIG. 13, it is determined that component p is not sucked to sixth suction nozzle 20(6) and tenth suction nozzle 20(10) (No in ST13), and the vacuum valve (valve unit 33) is closed in rotor index I8 and rotor index I12, respectively (ST 15). Then, the thickness calculating processes for sixth suction nozzle 20(6) and tenth suction nozzle 20(10) are canceled, and thickness calculating processes for seventh suction nozzle 20(7) and eleventh suction nozzle 20(11) are executed early.

Note that suction nozzle 20 (for example, first suction nozzle 20(1) or the like), which is determined in the component presence/absence determining process (ST13) that suction of component P is performed (Yes), is maintained in the "negative pressure supply state" and a change in the operation of the vacuum valve (valve unit 33) is not executed in fourth station S4.

In FIG. 10, when the component suction process is performed on twelfth suction nozzle 20(12) in rotor index I11 and the component suction processes on all of suction nozzles 20 are completed (Yes in ST4), component placing processor 47 causes nozzle-shaft-holding member 13 (rotor) to perform the index rotation of 30 degrees (ST5: second index rotation step). Thus, first suction nozzle 20(1) completes a full round and is positioned at first station S1 (rotor index I12).

Subsequently, component placing processor 47 executes the component placing process of placing component P that is sucked by first suction nozzle 20(1), to a predetermined placement position on board 3 (ST6: component placing process step). In the component placing process, the placement heights of suction nozzles 20 are corrected, based on thickness T (thickness data 42c) of component P obtained in thickness calculating step (ST14). Note that the component presence/absence determining process (ST13) at third station S3 and a process (ST15) of closing the vacuum valve (valve unit 33) at fourth station S4 are executed along with the component placing process at first station S1 until processes are completed on all of suction nozzles 20 (to twelfth suction nozzle 20(12)).

Hereinafter, while the component mounting process is not completed by all of suction nozzles 20 (No in ST7), second index rotation step (ST6) and component placing process step (ST6) are repeatedly executed. In other words, components P that are sucked by suction nozzles 20 are placed at the predetermined placement position on board 3 in order. At this time, the component placing process step (ST6) is skipped and the following second index rotation step (ST5) is executed on third suction nozzle 20(3), sixth suction nozzle 20(6), and tenth suction nozzle 20(10) by which component p is not sucked.

In FIG. 10, when the component placing process is completed by all of suction nozzles 20 (to twelfth nozzle 20(12) (Yes in ST7)), the flow returns to first index rotation step (ST2) and the component suction process is executed.

Component mounter 1 of the exemplary embodiment as described above includes side imaging camera 31 that is provided to be integral with placing head 8 having a plurality of suction nozzles 20, that moves relatively with respect to the plurality of suction nozzles 20, and thereby that images, from a side, peripheral regions of front ends 20a of suction nozzles 20, in order. Then, component presence/absence determiner 52 (determiner) determines presence or absence of component P sucked on front end 20a of suction nozzle 20, based on primary image data 61b obtained by side imaging camera 31, and thickness calculator 44 calculates thickness T of component P sucked on front end 20a of suction nozzle 20, based on secondary image data 42b obtained by side imaging camera 31.

In this manner, the controller (component presence/absence determiner 52) different from the controller (thickness calculator 44) that calculates thickness T of component P can determine the presence or absence of component P, and thereby making it possible to rapidly determine the presence or absence of component P on suction nozzle 20.

Note that, in the exemplary embodiment, the example, in which a rotary placing head 8 in which suction nozzles 20 are disposed on a circular circumference is employed, is described; however, the placing head is not limited thereto, and the disclosure may be applied to a type of placing head in which the plurality of suction nozzles 20 are straightly disposed. In this case, side imaging camera 31, which is movable with respect to straightly disposed suction nozzles 20, may be provided to be integral with the placing head.

Note that the process of determining the presence or absence of the component described in the exemplary embodiment is used to determine the presence or absence of component P on front end 20a of suction nozzle 20 after the suction operation of component P in first station S1, that is, to determine component suction failure; however, the process is not limited thereto. For example, after the suction operation of component P in first station S1, the process may also be used to determine a phenomenon in which suction nozzle 20 carries component P without placing the component, that is, so-called carrying of a component.

A component mounter of the disclosure is effective in that it is possible to rapidly determine presence or absence of a component on the suction nozzle, and thus the component mounter is applicable to a component mounting field in which a component is mounted on a board.

What is claimed is:

1. A component mounter that has a placing head having a plurality of suction nozzles, the component mounter comprising:
   a side imaging camera that is provided to be integral to a side of the placing head, that moves relatively with respect to the plurality of suction nozzles, and thereby is configured to image peripheral regions of front ends of the plurality of suction nozzles as the side imaging camera is moved relatively with respect to the plurality of suction nozzles;
   a determiner provided in the side imaging camera, wherein the determiner is a controller that determines a presence or absence of a component sucked by the front end of one of the plurality of suction nozzles, by processing image data of the side peripheral regions obtained by the side imaging camera; and
   a calculator provided in a main body of the component mounter positioned outside of the side imaging camera, wherein the calculator calculates a thickness of the component sucked by the front end of one of the plurality of suction nozzles, by processing the image data of the side peripheral regions obtained by the side imaging camera.

2. The component mounter of claim 1,
   wherein the determiner determines the presence or absence of the component, based on an average luminance value in a preset range in the image data.

3. The component mounter of claim 2,
   wherein the preset range in the image data is set for each of the plurality of suction nozzles.

4. The component mounter of claim 2,
   wherein the preset range in the image data is set, based on the image data obtained in a state in which a component is absent on the suction nozzle.

5. The component mounter of claim 1,
   wherein the determiner determines the presence or absence of the component, based on a contrast value in a preset range in the image data.

6. The component mounter of claim 1,
   wherein the determiner determines the presence or absence of the component and the calculator calculates the thickness of the component, based on the same image data.

7. A component mounter that has a placing head having a plurality of suction nozzles, the component mounter comprising:
   a side imaging camera that is provided to be integral to a side of the placing head, that moves relatively with respect to the plurality of suction nozzles, and thereby is configured to image peripheral regions of front ends of the plurality of suction nozzles as the side imaging camera is moved relatively with respect to the plurality of suction nozzles;
   a determiner provided in the side imaging camera, wherein the determiner is a controller that determines a presence or absence of a component sucked by the front end of one of the plurality of suction nozzles, by processing image data of the side peripheral regions obtained by the side imaging camera; and
   a calculator provided in a main body of the component mounter positioned outside of the side imaging camera, wherein the calculator calculates the thickness of the component sucked by the front end of one of the plurality of suction nozzles, by processing the image data of the side peripheral regions obtained by the side imaging camera,
   wherein, in a case where the suction nozzle performs a suction operation of a component, and then the determiner determines that a component is absent on the front end of the suction nozzle, a vacuum valve that supplies a vacuum to the end of the suction nozzle is closed.

8. The component mounter of claim 7,
   wherein, in a case where the suction nozzle performs the suction operation of a component, and then the determiner determines that a component is absent on the front end of the suction nozzle, the vacuum valve is closed and, in parallel, the calculator stops calculating the thickness of the component on the suction nozzle.

9. The component mounter of claim 7,
   wherein, in a case where the suction nozzle performs the suction operation of the component, and then the determiner determines that the component is present on the front end of the suction nozzle, the calculator calculates the thickness of the component that is sucked by the suction nozzle.

10. The component mounter of claim 7,
    wherein the determiner determines the presence or absence of the component, based on an average luminance value in a preset range in the image data.

11. The component mounter of claim 10,
    wherein the preset range in the image data is set for each of the plurality of suction nozzles.

12. The component mounter of claim 10,
    wherein the preset range in the image data is set, based on the image data obtained in a state in which a component is absent on the suction nozzle.

13. The component mounter of claim 7,
    wherein the determiner determines the presence or absence of the component, based on a contrast value in a preset range in the image data.

14. The component mounter of claim 7,
    wherein the determiner determines the presence or absence of the component and the calculator calculates the thickness of the component, based on the same image data.

* * * * *